United States Patent [19]
Cusdin

[11] Patent Number: 5,159,710
[45] Date of Patent: Oct. 27, 1992

[54] ZERO IF RECEIVER EMPLOYING, IN QUADRATURE RELATED SIGNAL PATHS, AMPLIFIERS HAVING SUBSTANTIALLY $\sinh^{-1}$ TRANSFER CHARACTERISTICS

[75] Inventor: Anthony R. Cusdin, Horley, England
[73] Assignee: U.S. Philips Corp., New York, N.Y.
[21] Appl. No.: 783,723
[22] Filed: Oct. 25, 1991

Related U.S. Application Data

[63] Continuation of Ser. No. 356,066, Jun. 12, 1989, abandoned.

[30] Foreign Application Priority Data

Jun. 17, 1988 [GB] United Kingdom ............... 8814412

[51] Int. Cl.$^5$ ........................... H04B 1/10; H04B 1/26
[52] U.S. Cl. ..................... 455/304; 455/324; 375/102
[58] Field of Search .............. 455/226, 313–314, 455/319, 324, 304, 226.1; 375/77, 94, 97, 102; 329/312

[56] References Cited

U.S. PATENT DOCUMENTS

| | | | |
|---|---|---|---|
| 3,585,506 | 6/1971 | Kiyasu et al. | 375/26 |
| 4,470,147 | 9/1984 | Goatcher | 375/77 |
| 4,570,125 | 2/1986 | Gibson | 455/324 |
| 4,583,239 | 4/1986 | Vance | 455/324 |
| 4,817,167 | 3/1989 | Gassmann | 455/324 |

FOREIGN PATENT DOCUMENTS

| | | |
|---|---|---|
| 0074858 | 3/1983 | European Pat. Off. |
| 2113930 | 8/1983 | United Kingdom |

OTHER PUBLICATIONS

R. S. Hughes, "Logarithmic Amplification with Application to Radar and EW", pp. 52, 53.

Primary Examiner—Reinhard J. Eisenzopf
Assistant Examiner—Andrew Faile
Attorney, Agent, or Firm—Jack D. Slobod

[57] ABSTRACT

A zero IF receiver which is capable of detecting short duration or CW signals and of operating over a large dynamic range includes an input terminal for receiving an input signal, a quadrature down-converter coupled to the input terminal for producing quadrature related, frequency down-converted signals in a pair of signal paths. These signal paths each include an amplifier having a substantially $\sinh^{-1}$ transfer characteristic so that the pair of signal paths produce substantially logarithmic quadrature related output signals which are coupled to a demodulator. The demodulator converts the quadrature related output signals into amplitude and frequency descriptions of the input signal relative to a center frequency of the receiver. The amplitude description is determined by selecting the one of the quadrature related output signals having the larger absolute value and applying an amplitude correction thereto. The frequency description is determined by forming an indication of the phase angle of the input signal from the difference between the quadrature related output signals, applying a phase correction thereto, and determining the rate of change of the corrected phase angle indication.

18 Claims, 4 Drawing Sheets

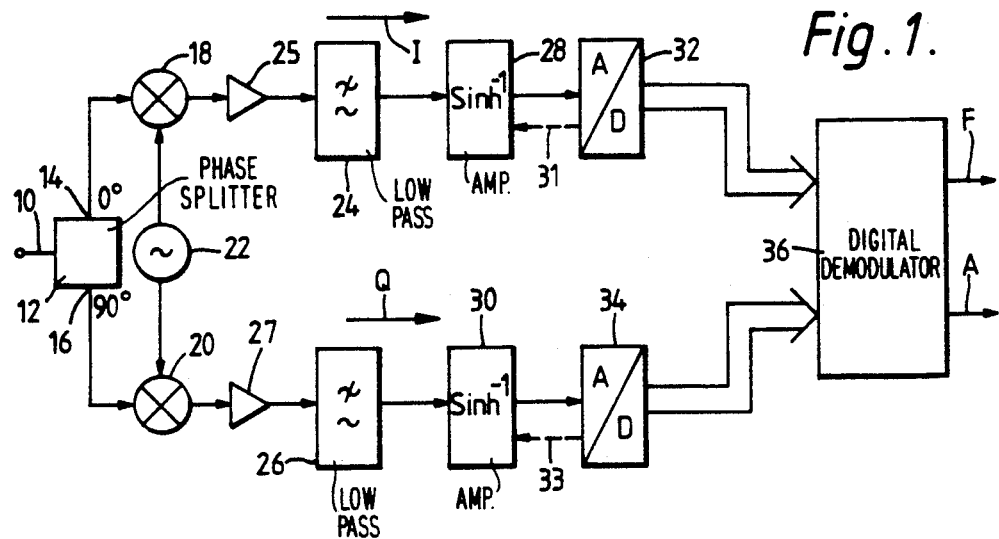
Fig. 1.
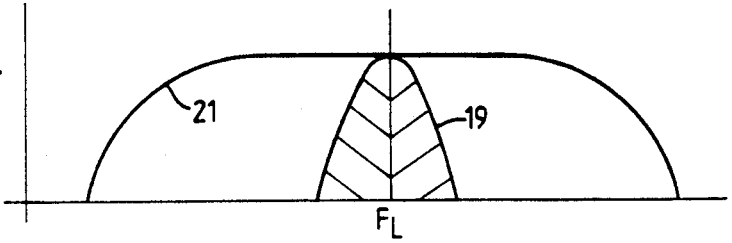
Fig. 2.
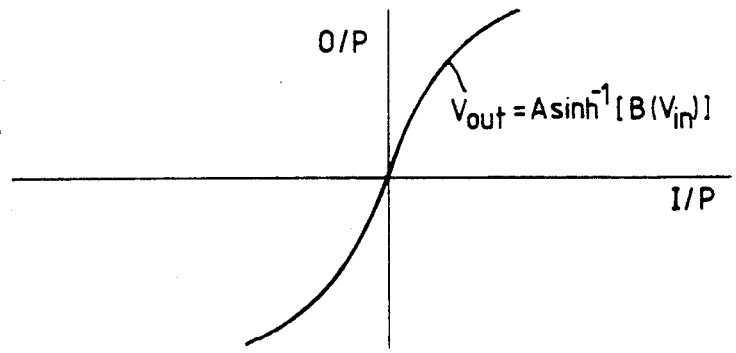
Fig. 3. $V_{out} = A\sinh^{-1}[B(V_{in})]$
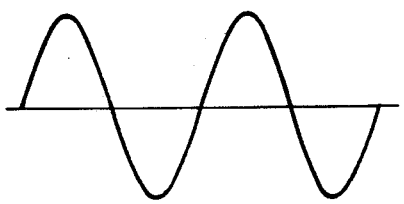
Fig. 4.
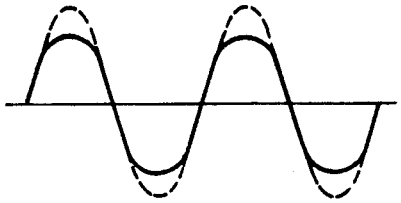
Fig. 5.

Fig. 7.

| | P | CF | F.M. |
|---|---|---|---|
| 1 | ─── | S S S | a |
| 2 | ─╱ | S S H | d |
| 3 | ─╲ | S S L | b |
| 4 | ╱╲ | S H L | c |
| 5 | ─╱ | S H S | d |
| 6 | ╱╱ | S H H | d |
| 7 | ╲╱ | S L H | b |
| 8 | ╲─ | S L S | b |
| 9 | ─╲ | S L L | b |
| 10 | ╱─ | H L S | b |
| 11 | ╱╲╱ | H L H | b |
| 12 | ╱╲ | H L L | b |
| 13 | ╱─ | H S L | c |
| 14 | ╱─ | H S S | c |
| 15 | ╱─╱ | H S H | c |
| 16 | ╱╲ | H H L | c |
| 17 | ╱ | H H S | d |
| 18 | ╱ | H H H | c |
| 19 | ╲╱─ | L H S | d |
| 20 | ╲╱ | L H H | d |
| 21 | ╲╱╲ | L H L | b |
| 22 | ╲╱ | L S H | b |
| 23 | ╲─ | L S S | b |
| 24 | ╲╲ | L S L | b |
| 25 | ╲╱ | L L H | b |
| 26 | ╲─ | L L S | b |
| 27 | ╲╲ | L L L | b |

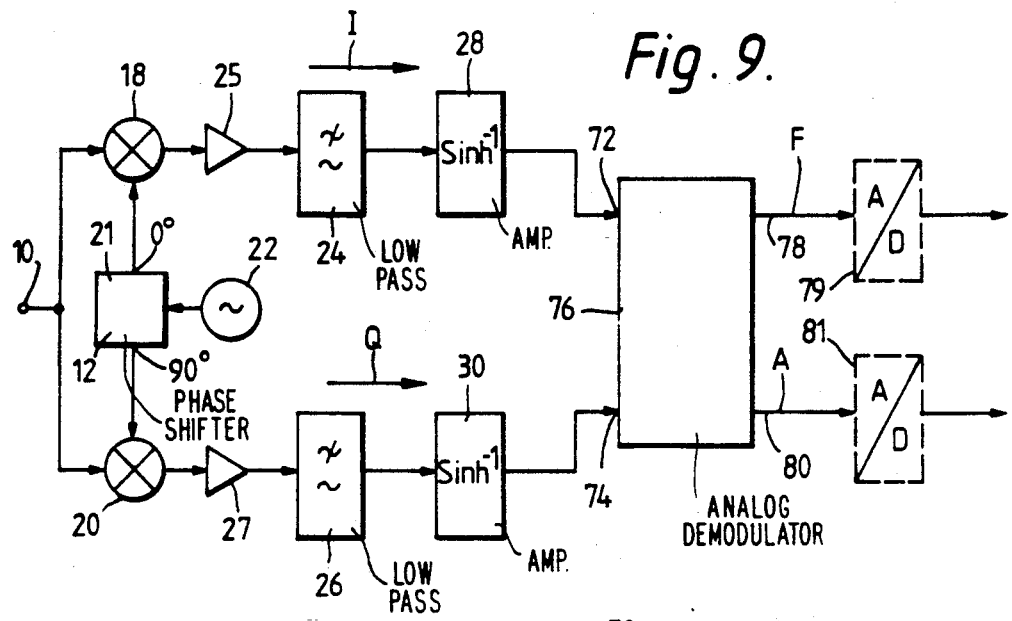
Fig. 9.
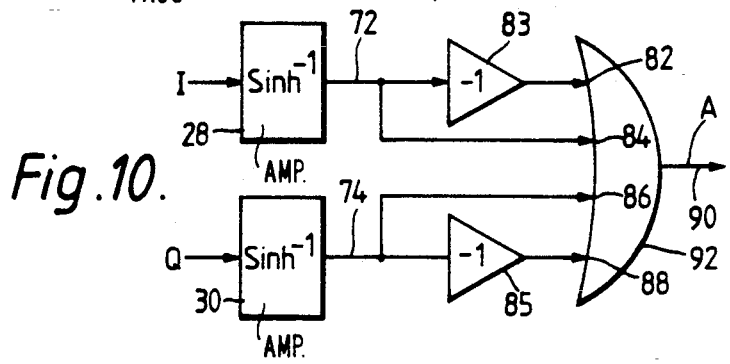
Fig. 10.
Fig. 11.
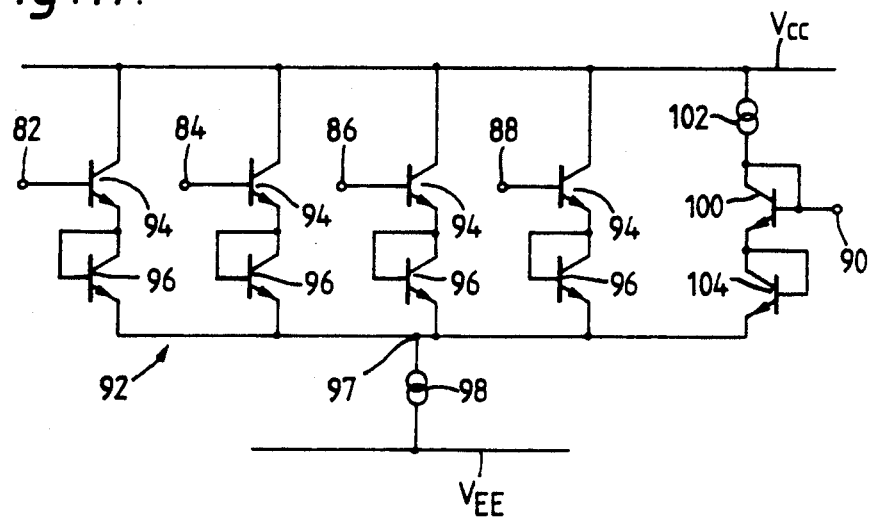

ZERO IF RECEIVER EMPLOYING, IN QUADRATURE RELATED SIGNAL PATHS, AMPLIFIERS HAVING SUBSTANTIALLY SINH$^{-1}$ TRANSFER CHARACTERISTICS

This is a continuation of application Ser. No. 07/365,066, filed Jun. 12, 1989 abandoned.

BACKGROUND OF THE INVENTION

1. Field of the Invention

The present invention relates to a zero IF receiver including a demodulator for deriving amplitude and frequency information.

2. Description of the Related Art

The zero IF technique is a well known method of implementing a narrowband radio frequency receiver, in which substantial parts of the receiver can be constructed in one integrated circuit. The filtering function at RF is implemented at baseband by the use of low pass filters in two quadrature channels "I" and "Q". In order to recover the signal from these two channels, some form of demodulation is required. Typically amplitude would be recovered by means of a "square and add" circuit, which is equivalent to the use of a square law detector in a conventional superhet receiver. Frequency would be recovered by means of a standard FM demodulator. The dynamic range over which the demodulator is required to work is often kept within reasonable bounds by means of an automatic gain control (AGC) loop. However, in some applications, for instance when a short duration signal, for example a pulsed sine wave, is received there is insufficient time for an AGC loop to operate over the full dynamic range of the receiver, say between 70 dB and 80 dB at RF, or 140 dB to 160 dB after amplitude demodulation. This makes the design of an integrated demodulator circuit very difficult, if not impossible, using conventional techniques.

SUMMARY OF THE INVENTION

An object of the present invention is to be able to derive the frequency and amplitude information from signals having a relatively large dynamic range.

According to the present invention there is provided a zero IF receiver comprising an input terminal for an input signal, means coupled to the input terminal for producing frequency down-converted in-phase and quadrature-phase signals, first and second amplifiers having a substantially sinh$^{-1}$ transfer characteristics, the frequency down-converted signals being applied to said first and second amplifiers, respectively, which produce first and second output signals corresponding substantially to the logarithm of the in-phase and quadrature-phase signals, and demodulating means, said demodulating means comprising means for determining the amplitude of the input signal by selecting that one of the first and second output signals having the larger absolute value and means for deriving the phase from the first and second output signals and for determining the frequency of the input signal relative to a centre frequency of the receiver from the rate of change of phase of said output signals.

The use of amplifiers having sinh$^{-1}$ transfer characteristics enables the dynamic range of the I and Q signals to be compressed and avoids the use of A.G.C. Once the dynamic range of the signal has been compressed, frequency and amplitude information can then be derived without the need for circuits of considerable complexity and thereby enable them to be of a form suitable for fabrication by integration.

Using amplifiers having a sinh$^{-1}$ transfer characteristic effectively means that with the exception of signals around zero volts, the outputs of the amplifiers are the logarithms of the signals applied to their inputs. This enables the demodulator to obtain phase and amplitude information relatively simply.

In one embodiment of the invention digitising means are coupled to respective outputs of the first and second amplifiers for providing digitised versions of the first and second output signals to the demodulating means which processes them digitally.

By subtracting the log of the in-phase (I) magnitude from that of the quadrature (Q) magnitude, a function is obtained which represents log of the tangent of phase within the range 0 to 90 degrees. This information together with information about the phase quadrant will define the phase of the signal in the range 0 to 360 degrees.

Ideally the I and Q signals are in quadrature, so their instantaneous amplitudes are both 3 dB less than the peak value, whenever their magnitudes are equal. By choosing the larger of the two magnitudes to represent the signal amplitude one is assured of being within 3 dB of the correct value. The accuracy of the amplitude value can be increased by adding corrections to the selected magnitude value.

Frequency is determined by forming a frame of a plurality of phase samples and firstly using all the samples in the frame to produce a frequency signal or secondly using subsets of the samples in the frame to produce other frequency signals. The frequency samples are supplied to respective inputs of a frequency selecting circuit. A frequency selection is made by producing a further signal indicative of the profile of a plurality of successive amplitude samples from the same frame. The further signal is supplied to the frequency selecting circuit which produces an output frequency signal. In an embodiment in which there are 4 phase samples per frame the frequency selecting circuit produces an output frequency signal on the basis of the following rules:

(1) if the amplitude is constant throughout the frame use the result of making use of all the phase samples (mode (a)), (2) if the amplitude is not constant throughout the frame do not use mode (a), (3) always use the maximum amplitude sample in the frequency measuring set, except where a constant amplitude section separates two rising sections, (4) use a constant amplitude section of the frame where possible, (5) where rules (1) to (4) leave a choice, use the first pair of samples which obey the rules.

In another embodiment of the present invention the demodulating means comprises analogue means for determining the one of the first and second output signals having the larger absolute value. Such analogue means may comprise an analogue OR-gate having inputs for receiving the first and second output signals and inverted versions of the first and second output signals, respectively.

The present invention also relates to a receiver comprising a plurality of zero IF receivers made in accordance with the present invention, each receiver having a local oscillator for producing a different frequency with respect to the frequencies produced by other local oscillators.

The present invention further relates to an interferometer comprising first and second receiving antennae located at a known distance apart, a plurality of pairs of first and second zero IF receivers made in accordance with the present invention, each pair having a common local oscillator for producing a predetermined frequency which is different from the frequencies produced by the other local oscillators, the first receivers of each pair being coupled to the first antenna, the second receivers of each pair being coupled to the second antenna, and phase difference measuring means coupled to the pairs of receivers.

BRIEF DESCRIPTION OF THE DRAWING

The present invention will now be described, by way of example, with reference to the accompanying drawings, wherein:

FIG. 1 is a block schematic diagram of an embodiment of a receiver made in accordance with the present invention, FIG. 2 illustrates how by setting the local oscillator frequency $F_L$, a selected part of an overall frequency band of interest is monitored by a receiver made in accordance with the present invention, FIG. 3 illustrates the transfer characteristic of the $sinh^{-1}$ (or logarithmic) amplifiers used in the receiver shown in FIG. 1, FIGS. 4 and 5 respectively illustrate input and output waveforms of the $sinh^{-1}$ amplifiers, FIG. 7 is a tabular summary of possible amplitude profiles, P, produced by the amplitude profile generator used in the data demodulator illustrated in FIG. 6.

FIG. 9 is a block schematic diagram of an embodiment of an analogue receiver made in accordance with the present invention, FIG. 10 illustrates one means by which an analogue amplitude signal A is obtained, and FIG. 11 is a schematic circuit of an embodiment of the analogue OR gate 92 used in FIG. 10.

DETAILED DESCRIPTION OF THE PREFERRED EMBODIMENTS

Figure 6:
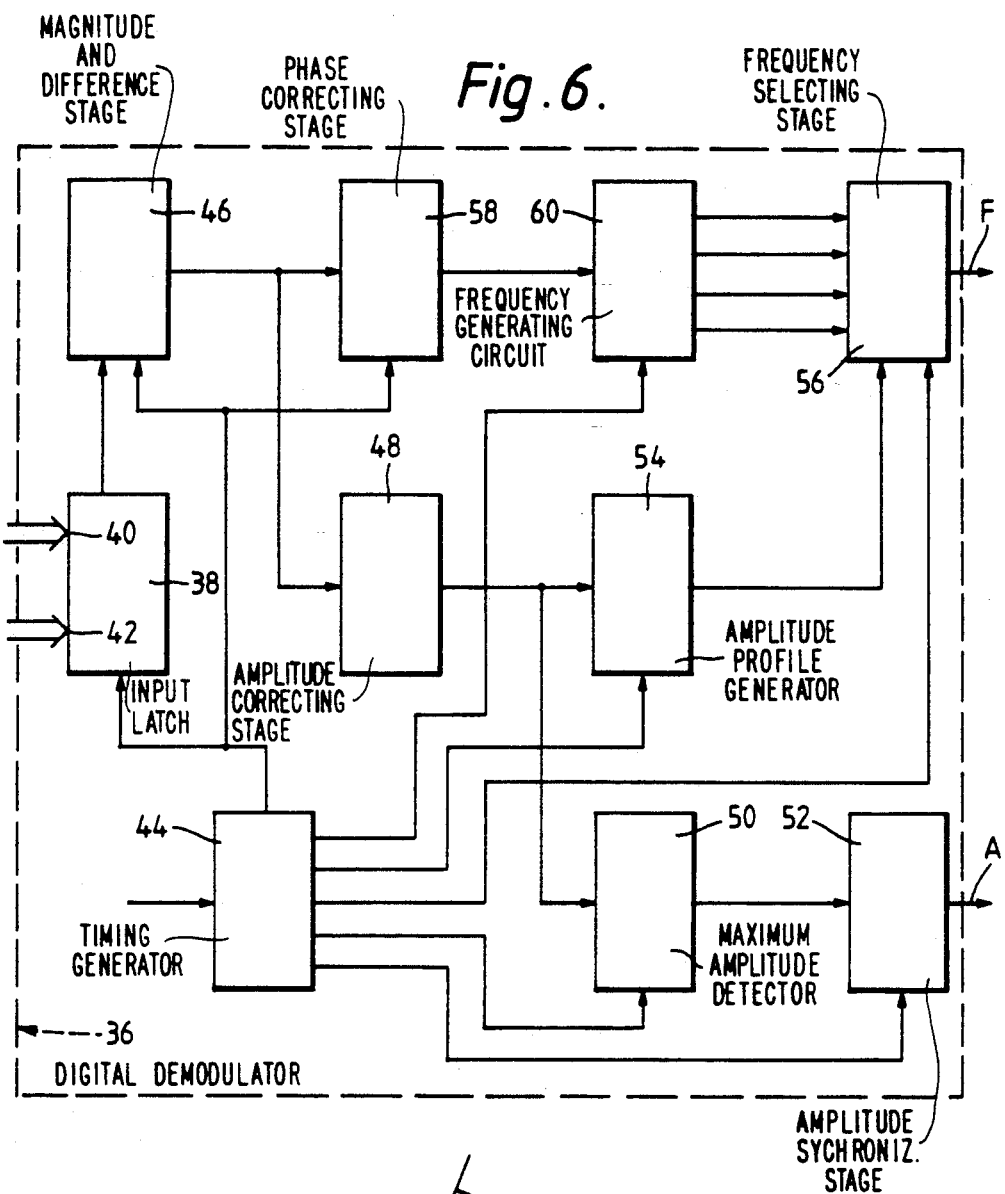
FIG. 6 is a block schematic diagram of the digital demodulator used in the receiver circuit shown in FIG. 1.

In the drawings the same reference numerals have been used to indicate corresponding features.

The zero IF receiver shown in FIG. 1 comprises an input 10 which receives an input signal either directly from an antenna or from a preceding amplifier and/or frequency down conversion stage (not shown). The input signal is applied to a phase splitter 12 which produces a signal (I) which is in-phase with the input signal on a first output 14 and a 90 degree phase shifted version (Q) of the input signal on a second output 16. The in-phase signal (I) and the quadrature phase signal (Q) are applied to respective signal paths. The I and Q signal paths are substantially identical and comprise mixers 18, 20 having first inputs connected to the first and second outputs 14, 16, respectively of the phase splitter 12. A local oscillator 22 generating a desired frequency, $F_L$, is coupled to second inputs of the mixers 18, 20. The frequency $F_L$ is chosen to receive transmissions within a selected narrow band 19 in an overall wider band 21 of possible interest (FIG. 2). Low pass filters 24, 26 connected to, or embodied in, the mixers 18, 20 select the difference frequency components in the mixer outputs. Optionally amplifiers 25, 27 are provided to amplify the outputs from the mixers 18, 20 before they are filtered. The signal components passed by the low pass filters 24, 26 are applied to respective amplifiers 28, 30 which have a $sin\ h^{-1}$ transfer characteristic as shown in FIG. 3. This characteristic which represents:

$$V_{out} = A\ sin\ h^{-1}[B(V_{in})]$$

where A and B are constants and $V_{in}$ and $V_{out}$ are the input and output voltages, respectively, is generally linear for very small input voltages and is substantially logarithmic for larger input voltages. The effect of these logarithmic regions is to compress the amplitude of input voltages. FIG. 4 illustrates a sine wave present at the input of the amplifiers 28, 30 and FIG. 5 illustrates the amplitude compressed signal at the output. More particularly for small positive or negative input voltages the response of each amplifier is linear but for signals above a certain level, each amplifier 28, 30 generates an output which is substantially equal to log ($V_{in}$) for positive input voltages, $V_{in}$, and substantially equal to $-\log(-V_{in})$ for negative input voltages. These substantially logarithmic voltages represent the instantaneous voltages on the dB scale. The signal outputs from the amplifiers 28, 30 are digitised in respective analogue to digital converters (ADC) 32, 34. In order to distinguish signals which are positive with respect to the mid-point of ADC input voltage range from negative signals, the positive signals are encoded with the most significant bit (m.s.b.) equal to a binary value "1" and the negative signals are encoded with the m.s.b. equal to a binary value "0". The ADCs 32, 34 set a reference value corresponding to the mid-point of the input voltage range of the ADC in the amplifiers 28, 30 by way of the connections 31, 33, respectively, shown in broken lines.

The digitised signals are processed in a digital demodulator 36 which uses the m.s.b. to determine if a signal is positive or negative with reference to the mid-point of the ADC input voltage range and operates on the other bits, to produce an amplitude output A, and a frequency output, F. The digital demodulator 36 will be described in greater detail with reference to FIG. 6.

Before describing FIG. 6 in detail the basic principles of the amplitude and frequency demodulation will be explained. Firstly the amplitude demodulation: Assume the signals in the "I" and "Q" channels are represented by:

$$V_i = V_m \cos(\omega t) \quad (1)$$

$$V_q = V_m \sin(\omega t) \quad (2)$$

where $V_m$ is the amplitude of the input signal. Consider first of all the case where $0 < \omega t < \pi/2$ and take the logarithms of equations (1) and (2). Thus:

$$\log(V_i) = \log(V_m) + \log(\cos(\omega t)) \quad (3)$$

$$\log(V_q) = \log(V_m) + \log(\sin(\omega t)) \quad (4)$$

Since $\sin(\omega t)$ and $\cos(\omega t)$ are both less than 1, equations (3) and (4) can be rewritten as follows:

$$\log(V_i) = \log(V_m) - E_i \quad (5)$$

$$\log (V_q) = \log (V_m) - E_q \quad (6)$$

where:

$$E_i = -\log (\cos (\omega t)) \quad (7)$$

$$E_q = -\log (\sin (\omega t)) \quad (8).$$

The quantities $E_i$ and $E_q$ are both positive and represent the differences between the logs of the instantaneous voltages in the "I" and "Q" channels and the log of the signal amplitude. When $\omega t$ is $\pi/4$, $V_i$ and $V_q$ are equal and both differ from the true signal amplitude by 3 dB. For all other values of $\omega t$, either $V_i$ or $V_q$ is within 3 dB of the signal amplitude. Thus a first approximation to the signal amplitude can be made simply by selecting the larger of the instantaneous voltages $V_i$ and $V_q$. This approximation will have an error of between 0 dB and 3 dB, depending on signal phase.

The accuracy of the amplitude estimate can be improved by adding a correction which depends upon the signal phase. This phase can be derived by subtracting equation (3) from equation (4).

$$\log (\tan (\omega t)) = \log (V_q) - \log (V_i) \quad (9)$$

The correction will be zero at phases of 0 and $\pi/2$ and +3 dB at a phase of $\pi/4$. The correction function is actually $E_i$ or $E_q$, depending upon whether $\omega t$ is less than, or greater than $\pi/4$. The value is determined from equations (7) or (8), using the value of $\omega t$ derived from equation (9).

So far we have considered only the range of phases where both $\sin (\omega t)$ and $\cos (\omega t)$ are positive. To extend the argument to the more general case it is necessary to use the absolute values of instantaneous voltage, $\cos (\omega t)$ and $\sin (\omega t)$ in equations (3) and (4):

$$\log (abs(V_i)) = \log (V_m) + \log (abs(\cos (\omega t))) \quad (10)$$

$$\log (abs(V_q)) = \log (V_m) + \log (abs(\sin (\omega t))) \quad (11).$$

This is now true for positive and negative instantaneous voltages and any signal phase. The coarse estimate of the signal amplitude, $V_m$, can still be made by selecting the larger of $abs(V_i)$ and $abs(V_q)$ and the correction functions $E_i$ and $E_q$ are still valid, if $\cos (\omega t)$ and $\sin (\omega t)$ in equations (7) and (8) are replaced by $abs(\cos (\omega t))$ and $abs(\sin (\omega t))$ respectively.

$$E_i = -\log (abs(\cos (\omega t))) \quad (12)$$

$$E_q = -\log (abs(\sin (\omega t))) \quad (13).$$

Since only the magnitudes of $\cos (\omega t)$ and $\sin (\omega t)$ are required to determine the correction function, it is possible to use the value of the magnitude of $\tan (\omega t)$ for this purpose. This can be derived from equations (10) and (11), in a similar manner to equation (9).

$$\log (abs(\tan (\omega t))) = \log (abs(V_q)) - \log (abs(V_i)) \quad (14)$$

The functions $\log (abs(V_i))$ and $\log (abs(V_q))$ are generated at the input to the demodulator 36.

Secondly the frequency demodulation:

The method of deriving signal amplitude described above involves the calculation of a function of signal phase from equation (14). This gives a value for the phase which is restricted to the range 0 to $\pi/2$ radians. The complete phase can be derived by combining the output of equation (14) with information about the phase quadrant. This is obtained from the signs of the outputs of the two $\sin h^{-1}$ amplifiers, which preserve the signs of the "I" and "Q" signals. Once the phase for each sample has been obtained, the signal frequency can be found from the rate of change of phase over a number of samples. In the illustrated embodiment the frequency is required to be measured every four samples. The demodulator was in consequence designed to derive the full signal phase for each sample and to use these phases in groups of 4 samples, in order to generate frequency measurements. It should be understood the number of samples in a group is not restricted to 4 and other numbers may be used.

Referring now to FIG. 6, the digital demodulator 36 comprises an input latch 38 which receives the digitised versions of the I and Q signals on inputs 40, 42. The input latch 38 is controlled by timing signals produced by the timing generator 44, which timing signals control the clocking-in of the digitised signals from the A to D converters 32, 34 (FIG. 1). The signals, $\log (abs(V_i))$ and $\log (abs(V_q))$, from the input latch 38 are clocked into a magnitude and difference stage 46 in which the signal amplitude is derived by choosing the larger of the I and Q signals, independently of its polarity or sign, and then making a small correction, as described above, in the stage 48. The correction calculated is simply added to the coarse amplitude value of the larger of the I and Q signals.

The correction effected is based on phase of a signal, that is ($\omega t$), obtained from equation (14). However this represents the phase restricted to a 90 degree sector. In order to determine phase over 0 to 360 degrees it is also necessary to know in which 90 degree sector the phase lies. This is found from the signs of the I and Q signals.

The corrected amplitude signal is applied to a maximum amplitude detector 50 which in the illustrated embodiment operates on frames containing 4 samples. The detector 50 operates by comparing the first and second samples in a frame and selecting the larger of the two against which the third sample is compared. The sequence is repeated by comparing the fourth sample with the largest of the first three. An amplitude synchronising stage 52 synchronises the reading out of the maximum amplitude signal on output A with the reading-out of a frequency signal on output F. In the present embodiment if the clock rate is assumed to be 20 MHz then the outputs A and F are read-out at 5 MHz because the signal samples at the inputs of the demodulator 36 are considered in groups of 4.

In alternative, non-illustrated embodiments the amplitude signal may be determined by calculating the average of the four samples in the frame, by selecting the most common amplitude or taking the amplitude on or about the point of frequency measurement.

The corrected amplitude signals from the stage 48 are supplied to an amplitude profile generator 54. The purpose of the generator 54 is to examine the shape of the incoming waveform and to select the appropriate samples from which to derive the frequency measurement by way of a frequency selecting stage 56.

The generator 54 comprises a window comparator which compares the amplitudes of successive samples within a 4-sample frame. For each comparison, a comparison output signal is produced which indicates whether the current sample is the same (S) as the last, that is it lies within a predetermined window, or whether it lies outside the window due to the current sample being too high (H) or too low (L). For the four samples within a frame, there are thus 3 comparisons and 27 possible combinations of comparator output. FIG. 7 is a tabular summary of the 27 possible profiles, P, together with the comparisons, CF, which describe the respective profiles and the frequency mode, F.M., which is activated in each case.

The size of the amplitude window is controllable by an external control bus so that the effects of noise and measurement errors can be accommodated.

Reverting to the magnitude and difference stage 46, the phase of each sample is derived from the difference between the magnitudes of the signals in the I and Q channels, which difference represents the log of the tangent of the phase angle in a 90 degree (or $\pi/2$ radians) sector. The phase angle information together with the sign information is applied to a phase correcting stage 58 which is implemented as a logical function but alternatively may be implemented as a look-up table. The output from the phase correction stage 58 comprises a linear phase measurement of the instantaneous signal between 0 degrees and 360 degrees. These phase measurements are sequentially applied to a frequency generating circuit 60.

The frequency generating circuit 60 calculates the signal frequency from the rate of change of phase within a 4-sample frame. There are four possible modes of operation, depending upon the amplitude profile detected by the amplitude generating circuit. The way the circuit works is to generate all four possible answers as the data arrives and then select the most appropriate one afterwards, once the amplitude profile is known.

The four modes are:
a) Making use of all 4 phase samples, generate an average frequency.
b) Use the first pair of phase measurements only.
c) Use the second and third phase measurements only.
d) Use the third and fourth phase measurements only.

The four modes are supplied by respective lines to the frequency selecting stage 56. The stage 56 decides which mode to adopt as being the frequency F in accordance with some rules.

The rules used to decide which mode to choose are (in hierarchical order of importance) as follows:
1. If the amplitude is constant throughout the frame use frequency mode (a) (FIG. 7).
2. If the amplitude is not constant throughout the frame do not use frequency mode (a).
3. Always include the maximum amplitude sample in the frequency measuring set, except where a constant amplitude section separates two rising sections (this may correspond to a pulse on pulse situation).
4. Use a constant amplitude section of the frame where possible.
5. Where rules 1 to 4 leave a choice, use the first pair of samples which obey the rules.

FIG. 7 shows the application of the above rules with the corresponding frequency measurement modes for each of the 27 possible amplitude profiles.

The only mode which requires phase ambiguity resolution is frequency mode (a). All other modes use adjacent pairs of phase measurements, which must be less than 180 degrees apart if they are to obey the Nyquist criterion. The phase difference between adjacent samples can therefore be converted directly into a frequency measurement.

The frequency calculation in mode (a) uses the average of 2 frequencies, derived from the first and third phase samples and the second and fourth phase samples respectively. For random, uncorrelated phase errors with equal variance, this method has a frequency variance which is almost as good as a least squares fit. However, it is much easier to implement and in some situations could give better results, since it gives equal weighting to all phase samples, rather than biassing the result in favour of the first and last phase sample as in the case of the least squares fit. Ambiguity resolution is also easier, since each half of the frequency calculation is done over two time intervals instead of three. Only one ambiguity resolution step is therefore necessary and moreover the required information can be obtained from differencing circuits used to calculate the frequencies for modes (b), (c) and (d).

The digital demodulator 36 can be implemented using combinations of logic elements and hence readily lends itself to be implemented as an application specific integrated circuit. The logarithmic amplifiers 28, 30 can be custom built to give a piecewise linear approximation to the curve shown in FIG. 3. Pages 52 and 53 of "Logarithmic Amplification—with Application to Radar and EW" by Richard Smith Hughes describe a suitable series linear-limit logarithmic video amplifier technique, which has been implemented in custom integrated circuit form for bipolar operation in this instance.

The ADCs 32, 34 may comprise any suitable known ADC, in the embodiment shown in FIG. 1 the ADCs 32, 34 comprised Datel ADC-207 video flash converters. The middle of the range of the output of each of logarithmic amplifiers 28, 30 is arranged to coincide with the midpoint reference of its associated ADC 32, 34 by means of the reference output 31, 33, respectively, of the ADCs 32, 34, which are coupled to the amplifiers 28, 30. The maximum anticipated voltage swing of the outputs of the amplifiers 28, 30 is arranged to correspond to the maximum range of resistive tappings of the ADC reference chain, that is the maximum voltage swing is between the positive and negative reference voltages of each ADC.

One application of the receiver shown in FIG. 1 is as a bank of parallel receivers for monitoring many frequencies simultaneously. A bank of such receivers can be provided with local oscillators tuned to different frequencies so that predetermined parts of the spectrum can be monitored for transmissions. The frequency, F, and amplitude, A, outputs of each digital demodulator are supplied to a central processor (not shown) which is capable of analysing the outputs obtained.

Figure 8:
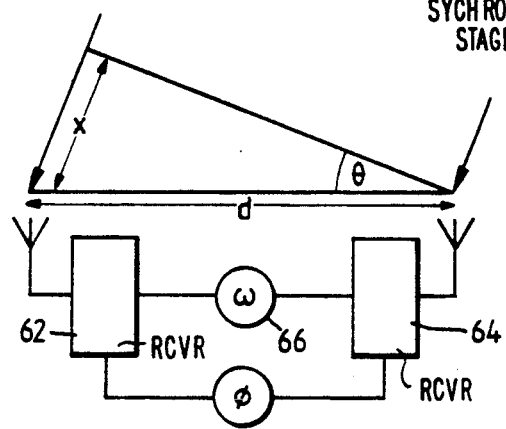
FIG. 8 is a block schematic diagram of an interferometer using two receivers of the type shown in FIG. 1 but having a common local oscillator.

Another application of the described receiver is in determining the bearing of an unknown signal source by interferometry. One such arrangement is shown in FIG. 8 which comprises two receivers 62, 64 having a common local oscillator 66 which provides a coherent signal to both receivers 62, 64. At least the antennae of the receivers are separated by a distance, d. A signal having a wavelength $\lambda$ is received at slightly different times by the receivers due to the path difference x. Hence there will be a difference in phase $\phi$ between the frequency signals produced by these receivers which can be used to determine the bearing 0 of the source (not shown) in accordance with the equation $$\phi = \frac{2\pi d \sin \theta}{\lambda}.$$

FIG. 9 illustrates an embodiment of the invention in which the I and Q signals are processed as analogue signals to provide the frequency F and amplitude A signals which may be digitised in ADCs 79, 81. More particularly a signal on input terminal 10 is applied to inputs of mixers 18, 20. A local oscillator signal $F_L$ from the local oscillator 22 is applied to a phase shifter 21 which provides in-phase and quadrature-phase local oscillator signals to the mixers 18, 20. The outputs of the mixers 18, 20 are amplified in amplifiers 25, 27, filtered in low pass filters 24, 26 and the wanted components of the filtered I and Q signals are applied to the sin $h^{-1}$ amplifiers 28, 30. The log ($V_i$) and log ($V_q$) signals are applied to respective inputs 72, 74 of an analogue demodulator 76. Outputs 78, 80 of the demodulator 76 provide the analogue values of the frequency F and amplitude A. If it is desired to have the frequency F and amplitude A expressed as digital values then ADC 79, 81 are connected to the outputs 78, 80, respectively.

One method of obtaining the maximum amplitude signal A is to use an analogue OR gate 92 (FIG. 10). The signals at the inputs 72, 74, of the demodulator are applied to inputs 84, 86, respectively, of the analogue OR gate and also are inverted in inverters 83, 85, the outputs of which are applied to inputs 82, 88, respectively. Using the inverters 83, 85 ensures that it is the absolute value which is selected as the maximum independent of sign.

FIG. 11 illustrates one embodiment of the analogue OR gate 92. Each of the inputs 82 to 88 is connected to the base electrode of a respective NPN transistor 94 connected as an emitter follower. The emitter load of the transistor 94 comprises another NPN transistor 96 connected as a diode, its base and collector electrodes being connected together. The emitters of the four transistors 96 are connected to one terminal 97 of a constant current source 98, the other terminal being connected to the $V_{EE}$ line. The collectors of the transistors 94 are connected to the $V_{CC}$ line.

The output of the analogue OR gate 92 is derived from the base electrode of a diode connected NPN transistor 100 whose collector electrode is connected by way of a constant current source 102 to the $V_{CC}$ line. The current generated by the source 102 is set at one half of the value of the current generated by the source 98. The emitter electrode of the transistor 100 is connected to another diode connected NPN transistor 104 whose emitter electrode is connected to the terminal 97 of the constant current source 98.

In operation the input terminal 82 to 88 which has the highest voltage applied to it will cause its associated transistor 94 to be highly conductive and raises the voltage at the terminal 97. This rise in voltage turns-off all the other input transistors 94 whose base voltages are lower. The voltage at the output 90 rises to a level equal to the highest input voltage, in order to sustain the current flow equal to the current source 102. In this state, equal currents are flowing in the active one of the input transistors 94 and the output transistors 100, 104. Monitoring the output at the amplitude terminal 90 thus provides a means of selecting the largest input voltage. Moreover the amplitude correction required when neither I or Q represents the maximum voltage is provided automatically by this circuit. When two inputs are almost equal, the current is shared by two of the four input transistors 94 and the emitter-base voltages of these transistors are less than when all the current flows in one of the input transistors only. Thus the output voltage is raised to about the input level in this situation and by careful scaling of the input levels, this offset voltage can be arranged to track very closely with the desired correction.

I claim:

1. A zero IF receiver comprising an input terminal for an input signal having a frequency proximate a center frequency, means coupled to the input terminal for down-converting said input signal in frequency relative to said center frequency to produce down-converted in-phase and quadrature-phase signals, first and second amplifiers fed by said down-converting means and having a substantially $\sinh^{-1}$ transfer characteristic, the in-phase and quadrature-phase signals produced by said down-converting means being applied to said first and second amplifiers, respectively, which produce first and second output signals corresponding substantially to the logarithm of the in-phase and quadrature-phase signals, and demodulating means, said demodulating means comprising means for determining an indication of amplitude of the input signal by selecting, as an estimate of the amplitude of the input signal within 3 db of the correct value, that one of the first and second output signals having the larger signal absolute value and means for deriving an indication of phase angle of the input signal from the difference between the first and second output signals.

2. A receiver as claimed in claim 1, further comprising digitizing means having inputs coupled to respective outputs of the first and second amplifiers and outputs coupled to the demodulating means, the digitizing means providing digitized versions of the first and second output signals.

3. A receiver as claimed in claim 2, wherein the demodulating means comprises a latch for temporarily storing corresponding samples of the digitized versions of the first and second output signals, respectively.

4. A receiver as claimed in claim 3, wherein the means for deriving an indication of phase angle comprises means for substracting one of the corresponding signal samples from the other to provide the logarithm of the tangent of the phase angle in a 90 degree sector.

5. A receiver as claimed in claim 4, wherein the means for deriving an indication of phase angle comprises means for determining in which 90 degree sector the phase angle lies in response to the signs of the corresponding signal samples.

6. A receiver as claimed in claim 1, wherein the means for determining an indication of amplitude comprises means for correcting the estimate of amplitude to form a corrected amplitude signal by adding a correction dependent on the indication of phase angle.

7. A receiver as claimed in claim 6, wherein the demodulating means further comprises means for comparing a predetermined number of samples of the corrected amplitude signal and selecting the largest signal sample as an amplitude description of the input signal.

8. A receiver as claimed in claim 6, wherein the means for deriving an indication of phase angle comprises means for generating an amplitude profile signal indicating a result of successively comparing pairs of samples of said corrected amplitude signals, a predetermined number of successive corrected amplitude signal samples forming a frame.

9. A receiver as claimed in claim 1, wherein the means for determining an indication of amplitude comprises analog means for determining the one of the first and second output signals having the larger absolute value.

10. A receiver as claimed in claim 9, wherein the analog means comprises an analog OR-gate having inputs for receiving the first and second output signals and inverted versions of the first and second output signals, respectively.

11. A receiver comprising a plurality of zero IF receivers each as claimed in claim 1, wherein the down-converting means of each receiver down converts with respect to a different center frequency as determined by a local oscillator included in the down-converting means.

12. An interferometer comprising two receivers, each as claimed in claim 1, said receivers having a common center frequency and respective antennae, at least the antennae of the receivers being spaced apart by a known distance, and further comprising a phase difference measuring device fed by respective indications of phase angle derived by the receivers.

13. An interferometer comprising first and second receiving antennae located at a known distance apart, a plurality of pairs of first and second zero IF receivers each receiver being as claimed in claim 1, each pair having a common center frequency which is different from the center frequencies produced by the other pairs of receivers, the first receivers of each pair being coupled to the first antenna, the second receivers of each pair being coupled to the second antenna, and phase difference measuring means coupled to the plurality of pairs of receivers for receiving indications of phase angle derived by the receivers.

14. A receiver as claimed in claim 7, wherein the means for determining an indication of phase angle comprises means for generating an amplitude profile signal indicating a result of successively comparing pairs of samples of said corrected amplitude signals, a predetermined number of successive corrected amplitude signal samples forming a frame.

15. A receiver as claimed in claim 8, further comprising frequency determining means for determining frequency by using phase samples derived from the indication of phase angle and selected from said predetermined number of successive phase samples forming a frame to determine a rate of change of amplitude of phase samples.

16. A receiver as claimed in claim 15, wherein said frequency determining means comprising means for generating a plurality of different determinations of frequency, one resulting from making use of all of the phase samples in a same frame and others resulting from making use of different subsets of the phase samples in the same frame.

17. A receiver as claimed in claim 16, wherein the frequency determining means comprises frequency selecting means having an input for the amplitude profile signal and the plurality of inputs to each of which one of said plurality of different determinations of frequency produced by the means for generating said different determinations of frequency is supplied and an output for an output frequency selected by said frequency selecting means from among said plurality of different determinations of frequency based on the amplitude profile signal.

18. A receiver as claimed in claim 17, wherein said predetermined number is four and the frequency selecting means selects the output frequency as follows:
1) if the amplitude of the samples of the corrected amplitude signal are constant throughout the frame, the one determination of frequency is selected which results from making use of all the phase samples in the frame; but
2) if the amplitudes of the samples of the corrected amplitude signal are not constant throughout the frame, then the determination of frequency is selected which results from a pair of phase samples:
   a) which always includes the phase sample corresponding to the maximum corrected amplitude sample, except where a constant corrected amplitude section of the frame separates two sections in which corrected amplitudes rise; and
   b) where possible corresponds to samples of corrected amplitudes within a constant corrected amplitude section of the frame.

* * * * *